United States Patent [19]
Wishneusky

[11] Patent Number: 5,864,716
[45] Date of Patent: Jan. 26, 1999

[54] TAGGED DATA COMPRESSION FOR PARALLEL PORT INTERFACE

[75] Inventor: John A. Wishneusky, Bolton, Mass.

[73] Assignee: Cirrus Logic, Inc., Fremont, Calif.

[21] Appl. No.: 912,317

[22] Filed: Apr. 26, 1996

Related U.S. Application Data

[63] Continuation of Ser. No. 434,716, May 4, 1995, abandoned, which is a continuation of Ser. No. 178,673, Jan. 7, 1994, abandoned.

[51] Int. Cl.$^6$ .............................. H03M 7/30; G06F 7/20
[52] U.S. Cl. .................. 395/888; 364/715.11; 345/202; 341/59; 382/245; 707/101
[58] Field of Search .............................. 341/59; 382/245; 345/202; 395/888; 707/101; 364/715.11

[56] References Cited

U.S. PATENT DOCUMENTS

| | | | |
|---|---|---|---|
| 4,729,020 | 3/1988 | Schaphorst et al. | 348/419 |
| 4,947,858 | 8/1990 | Smith | 600/509 |
| 5,019,967 | 5/1991 | Wheeler et al. | 395/775 |
| 5,020,121 | 5/1991 | Rosenberg | 382/238 |
| 5,060,286 | 10/1991 | Miller | 382/239 |
| 5,113,494 | 5/1992 | Menendez et al. | 395/163 |
| 5,123,061 | 6/1992 | Pritchard | 382/56 |
| 5,142,282 | 8/1992 | Tobin et al. | 341/55 |
| 5,146,221 | 9/1992 | Whiting et al. | 341/67 |
| 5,151,697 | 9/1992 | Bunton | 341/51 |
| 5,170,266 | 12/1992 | Marsh et al. | 358/468 |
| 5,175,543 | 12/1992 | Lantz | 341/51 |
| 5,241,546 | 8/1993 | Peterson et al. | 371/37.1 |
| 5,245,441 | 9/1993 | Ruben | 358/426 |
| 5,321,750 | 6/1994 | Nadan | 380/20 |
| 5,410,671 | 4/1995 | Elgamal et al. | 395/425 |

OTHER PUBLICATIONS

"Extended Capabilities Port: Specifications", Microsoft® Corporation, Revision 1.04, Apr. 28, 1993.
Errata Sheet Corrections to the Extended Capabilities Port Protocol and ISA Interface Standard, Revision 1.07, dated Dec. 2, 1992; Revision 1.08, dated Dec. 18, 1992; Revision 1.09, dated Jan. 7, 1993; Revision 1.10, dated Feb. 4, 1993; Revision 1.11, dated Feb. 10, 1993, ECP Errata, Apr. 28, 1993, pp. 1–10.
Cirrus Logic, CL–CD1284 Preliminary Data Book, Aug. 1993, pp. 1–152.
Extended Capabilities Port Protocol and ISA Interface Standard, Microsoft® Corporation, Revision 1.12, Apr. 28, 1993, pp. 1–42.

Primary Examiner—Alyssa H. Bowler
Assistant Examiner—John Follansbee
Attorney, Agent, or Firm—Lowe Price LeBlanc & Becker; Frank D. Nguyen; Gary Goates

[57] ABSTRACT

A bi-directional data pipeline for interfacing a memory with a communications port includes a series of four pipeline elements comprising two DMA buffers and first and second holding registers. A data word is transferred from memory to the DMA buffers, each holding one data byte of the data word. With each clock cycle, the data bytes are successively transferred through the two holding registers. Two comparators are used to determine if three successive identical data bytes are present in the pipeline. If three identical bytes are detected, run length encoding is enabled, and a run length count register is incremented for each successive identical byte received through the pipeline. The run length count and associated data byte are transferred to a FIFO for transmission over the data path. A tag associated with the run length count distinguishes the run length count from data bytes in the FIFO. Data received through the FIFO is decompressed by detecting the run length count tag and loading the run length count into the run length count register. The associated data byte is loaded into one of the holding registers and copied with each successive clock cycle, decrementing the run length count register. System development tools are provided with the pipeline for debugging purposes.

20 Claims, 3 Drawing Sheets

TAGGED DATA COMPRESSION FOR PARALLEL PORT INTERFACE

This application is a continuation of application Ser. No. 08/434,716 filed May 4, 1995, now abandoned, which is a continuation of application Ser. No. 08/178,673, filed Jan. 7, 1994, now abandoned.

TECHNICAL FIELD

The present invention is related generally to providing improved data compression in a parallel port interface. The present invention has particular application for the Extended Capabilities Port (ECP) using the IEEE 1284 standard and Run Length Encoding (RLE).

BACKGROUND ART

Data transmission rates necessary for modern, high performance computer printers and peripherals are much higher than early model printers. For example, early computer printers using daisy wheel or dot matrix impact printing technologies relied upon a limited number (e.g., 128) of character codes (typically ASCII) transmitted by a host computer to generate and print characters. Further, the printing rate of such early impact printers (on the order of several characters per second) did not require a high data transmission rate.

More advanced dot matrix printers having limited graphics functions typically did not require great data bandwidth, as resolution (dots per inch) was limited. Simple serial (e.g., RS-232) or parallel interfaces (e.g., Centronics™ or the like) were more than suitable for these early printing devices.

However, newer printers, (e.g., laser printers or the like) are capable of more complex graphics functions, greater print speeds, and two-way communication between the device and a host computer (e.g., network applications or the like). In addition, new peripherals have been developed for graphics use (e.g., scanner or the like) which require transmitting large amounts of data to a host computer. Thus, typical prior art parallel port interfaces (e.g., Centronics™ or so-called LPT ports or the like) have proved to be a bottleneck in data transmission from a host computer to a high performance printer, or from a scanner to a host computer.

In addition, newer, more sophisticated peripheral devices such as laser printers, have increased needs for two-way communication between a host computer and the peripheral, such as in network printer applications. Prior art parallel port interfaces were not suitably adapted to readily provide such two-way communication.

New parallel interface standards have been adapted to improve over the prior art Centronics™ ports. One example of such a standard is the IEEE P1284 specification or the Industry Standards Associate (ISA) Extended Capabilities Port (ECP) protocol both of which are incorporated herein by reference. These new protocols may be provided in a communications port which is backwardly compatible with earlier communications standards (e.g., Centronics™ or the like). The ECP protocol allows for Direct Memory Access (DMA) to improve data transmission rates. In addition, the ECP protocol may be provided with Run Length Encoding (RLE) to compress data and further increase data transmission rates.

RLE can compress up to 128 bytes of identical data into two bytes of information, thus providing up to a 64:1 compression ratio. In printing and scanning applications, repetitive data bytes are common. For example, in alphanumeric printing applications, a repeated number of ASCII characters may be transmitted representing blank spaces (i.e., ASCII 32, or 0010000). In graphics applications, where raster scanning techniques may be used to represent individual pixels or dots of information, large amounts of repetitive pixels may be transmitted to draw, for example, a straight line, or represent a large blank area. RLE compresses the data into a command byte representing the number of times the byte is repeated, and a data byte, which represents the byte to be repeated.

To decompress the data, the process is reversed. The command byte is received, and the peripheral device (or computer host, depending on direction of data transmission) repeats the following byte the number of times indicated by the command byte. In the ECP protocol, the computer host or peripheral distinguishes from command and data bytes by monitoring the HostAck (nAutoFd) pin (pin number 14). When the HostAck pin is high, the information transmitted on pins 2 through 9 is a data byte. When the HostAck pin is low, the information transmitted on pins 2 through 9 is a command byte. If the most significant bit (MSB) of the command byte is low, the command is a run length count. Thus, only seven bits are available for a maximum run length count of 128.

Although the ECP protocol provides for the use of run length encoding, the protocol does not set forth an efficient and economical technique for performing run length encoding. An intuitive approach to performing such encoding might comprise storing data within a memory, and compressing the data into RLE format before transmission by performing encoding operations on the data in memory. However, such a technique is time consuming and may require additional hardware or operation steps.

Thus, it remains a requirement in the art to provide an economical and efficient technique for implementing run length encoding in the ECP protocol.

DISCLOSURE OF THE INVENTION

A bi-directional data pipeline interfaces a memory with a communications port. The pipeline includes a first memory buffer which receives a high data byte from the memory and transfers a high data byte to the memory. A second memory buffer receives a low data byte from the memory and transfers the low data byte to the memory. A first holding register selectively receives a high or low data byte from the first and second memory buffers. A second holding register receives a high or low data byte from the first holding register and transfers the high or low data byte to the first and second memory buffers, respectively. A FIFO receives a high or low data byte from the second holding register and transfers a high or low data byte to the first holding register. A first comparator compares the contents of the first and second holding registers and a second comparator compares the contents of the first holding register with one of the first and second memory buffers. A run length count register stores a byte of information indicating a number of identical data bytes.

A control logic controls the transmission and compression of data in the pipeline in a first direction by comparing the output of the first and second comparators and incrementing the run length count register by one if the first and second comparators show that the contents of the first and second holding registers and one of the first and second memory buffers are identical. The contents of the run length count register are output to the FIFO, followed by the data byte stored in the second holding register.

The control logic also controls reception and decompression of data in the pipeline in a second direction by receiving from the FIFO a first byte of data and a tag corresponding to the first byte of data. If the tag has a predetermined value, the first byte of data is stored in the run length count register and a second byte is retrieved from the FIFO and stored in the first holding register. The contents of the first holding register are copied to the second holding register and the run length count register is decremented by one.

It is an object of the present invention to provide a parallel port interface which implements run length encoding in the ECP protocol.

It is a further object of the present invention to compress and expand data in real time within a parallel port interface using the run-length encoding protocol.

It is a further object of the present invention to provide a parallel port interface which allows for direct memory access to a system memory while providing data compression and decompression in real time.

It is a further object of the present invention to provide a parallel port interface which converts data stored within a memory having a predetermined width to a byte having a width different from the width of the memory, and transmits the data through a parallel data path.

It is yet a further object of the present invention to provide a parallel data port interface which may selectively read or write data to or from a memory using direct memory access or random access and to transmit or receive data through the parallel port.

It is a further object of the present invention to provide a pipeline data error holding register to flag underwrite and bubble conditions within a pipeline to allow a development engineer to troubleshoot and debug a system incorporating the pipeline.

It is a further object of the present invention to provide for the transfer of a command data address byte embedded in a data stream to a host processor after transferring and processing normal data bytes preceding the command address byte.

BEST MODE FOR CARRYING OUT THE INVENTION

Pipeline Elements

Figure 1:
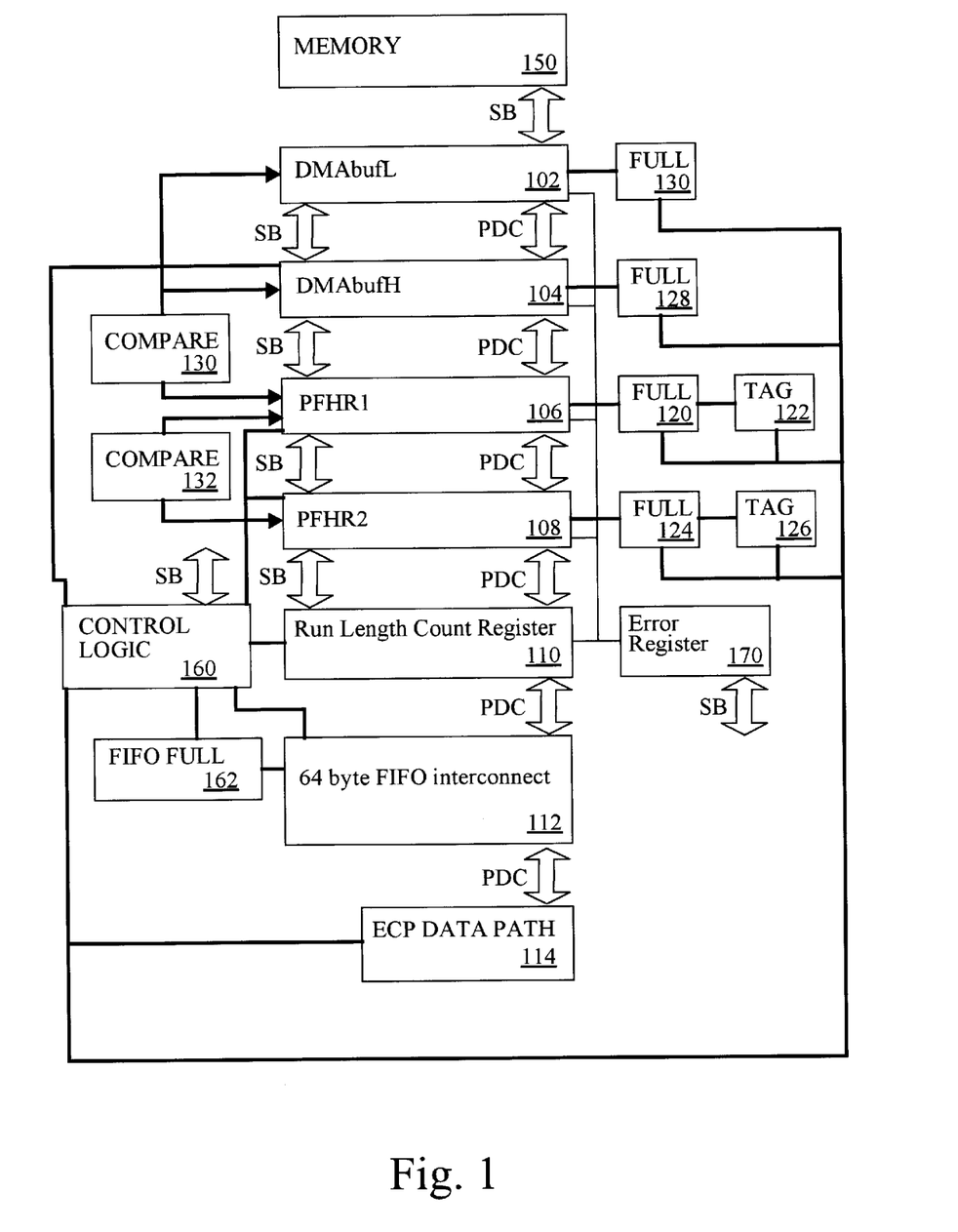
FIG. 1 shows a block diagram of the pipeline coding apparatus of the present invention.

FIG. 1 shows a block diagram of the pipeline of the present invention as applied in a peripheral device or host computer. Memory 150 may comprise a dynamic random access memory (DRAM) 16 bits in width within a peripheral device or host computer. ECP data path 114 comprises a parallel data path (e.g., connecting cable with 36 pin Centronics™ connector) configured to the ECP protocol.

The pipeline consists of two parallel FIFO holding registers PFHR1 106 and PFHR2 108, run length count register 110, DMA buffer holding registers DMAbufL 102 and DMAbufH 104, and 64 byte FIFO 112. Elements within the pipeline are connected through a series of eight bit connections collectively referred to as pipeline data connection PDC. Pipeline data connection PDC, as well as each element of the pipeline, are under control of internal control logic 160 such that data may be selectively transferred from one element in the pipeline to another element in the pipeline. As discussed below, the data path for the transmit and receive directions may differ. Further, in either data transfer direction, data may be selectively transferred into either of DMA buffers DMAbufL 102 or DMAbufH 104. Thus, control logic 160 may be provided to selectively alter the data path of the pipeline for transmit and receive directions as well as for high and low data bytes. Alternately, control logic 160 may be provided so as to enable data transfer between any two elements in the pipeline.

Thus, under direction of control logic 160, data may be transferred between the elements in the pipeline. Each of holding registers PFHR1 106 and PFHR2 108 have full and tag holding registers 120, 122, 124, and 126, respectively. When either PFHR1 106 or PFHR2 108 is full, its corresponding full holding register goes high. These holding registers are monitored by control logic 160. All of the elements of the pipeline may be provided within a VLSI or custom ASIC.

DMA buffer holding registers DMAbufL 102 and DMAbufH 104, are provided for buffering data between the pipeline and the memory 150. The DMA buffers DMAbufL 102 and DMAbufH 104 are coupled to the memory 150 through a System Bus SB. System Bus SB may comprise a System Bus within a host computer or within a peripheral device (e.g., laser printer or the like).

DMA buffers DMAbufL 102 and DMAbufH 104 are provided in order to interface with System Bus SB which may comprise a 16 bit data bus. ECP data path 114 using the ECP protocol is 8 data bits wide. Thus, information from the System Bus SB must be multiplexed 8 bits at a time onto the data path using DMA buffers DMAbufL 102 and DMAbufH 104.

DMAbufL 102 stores the low byte of a 16 bit word whereas DMAbufH 104 stores the high byte of a 16 bit word for a System Bus SB. The pipeline supports both types of endian formats, so long as each device on either end of the ECP data path is using the same endian format. Thus, the high byte may be transmitted first, followed by the low byte, or vice versa.

Data is transferred to and from the data path through a 64 byte FIFO 112. Each byte in the 64 byte FIFO 112 is 9 bits in length. The ninth bit of each byte is used as a tag to designate whether the data in the remaining 8 bits comprises normal data (ASCII code or the like) or a control code. FIFO 112 is interfaced with ECP data path 114 which may comprise a parallel port using the ECP protocol. This parallel port is essentially a half duplex system which is set up for one direction of data flow. Data may transfer in either direction, however, data flow can only be transmitted in one direction at a time.

Operation of Pipeline for Received Data

When data is received from ECP data path 114, for example using the ECP protocol, the control logic 160 monitors whether the data is a data byte or a command byte. As discussed above, in the ECP protocol, command and data bytes may be distinguished by monitoring the HostAck (pin number 14). When the HostAck pin is high, the information received is a normal data byte. When the HostAck pin is low the information received is a command byte.

The status of the HostAck pin in ECP data path 114 is monitored by control logic 160 and stored as the ninth bit or tag bit accompanying the corresponding data byte in FIFO 112. For example, if a byte is a command byte, the tag bit may be stored as a logic "1", whereas if the byte is a normal data byte, the tag bit may be a logic "0". Control logic 160 will later monitor this tag bit as the data within FIFO 112 passes through the pipeline to determine whether decompression is necessary. By storing the byte status as a tag bit, processing delays are unnecessary, and the data flow over ECP data path 114 is uninterrupted. The use of tag bit allows compressed data to be placed in within the FIFO, thus maximizing the data capacity of the FIFO. If the FIFO were used to store decompressed data, the size of the FIFO would be increased to accommodate the decompressed data and subsequent ECP data transfer would be delayed while the compressed data was being decompressed and placed in the FIFO.

Depending on the status of the tag bit, data from FIFO 112 passes either to run length count register 110 or to holding register PFHR1 106. For example, if the tag bit of a byte in FIFO 112 is logic "0", then the data contained within the byte is considered ordinary data and passes to holding register PFHR1 106. Control logic 160 is provided with a clock signal (not shown) to move data bytes through the pipeline with each clock cycle. For ordinary data, the data bytes stored in FIFO 112 from ECP data path 114 pass sequentially from FIFO 112 over pipeline data connection PDC to PFHR1 106, then to PFHR2 108, with each clock cycle. From PFHR2 108, data bytes are transferred over pipeline data connection PDC to one of the two DMA buffers DMAbufL 102 or DMAbufH 104.

Which DMA buffer is fed from PFHR2 108 depends on the endian format of the data transmission, and whether the previous data byte was a low or high data byte. For example, in small endian transmission format, the first data byte received is presumed to be a low byte and thus would be transmitted to DMAbufL 102. The following byte would be presumed to be a high byte and be transmitted to DMAbufH 104.

Once the DMA buffers DMAbufL 102 and DMAbufH 104 are full, a sixteen bit word has been assembled from the two bytes and is transmitted over system bus SB to memory 150 using direct memory access (DMA). Since the flow through the pipeline is uninterrupted, direct memory access is possible, and sixteen bit words may be sequentially written into the memory as often as every third each clock cycle.

If a byte from FIFO 112 has a tag bit, this byte is recognized as a command byte. If the command byte is a run length count, the byte is transferred to run length count register 110. It should be recognized that the ECP protocol provides that the command byte may comprise a run length count byte, or an channel address byte. These channel address bytes may be used to implement features specific to a peripheral device in a manner similar to control codes or so-called escape sequences (e.g., an ASCII character 27 (ESC) followed by one or more data bytes). Thus, control logic 160 reads the MSB of the command byte to determined whether the command byte is a run length count (logic "0") or channel address (logic "1").

The processing of channel address bytes takes place in a manner particular to the specific peripheral device and forms no part of the present invention. Tag holding registers 122 and 126 are provided to receive data tags from FIFO 112. If a command byte is determined to be an address byte (from the MSB of the command byte), the byte is transferred to holding register PFHR1 106 and the tag status bit (indicating a command byte) is transferred to tag holding register 122. If holding register PFHR2 108 contains data byte to be transferred to memory 150, control logic 160 will advance the pipeline to allow that data byte to be transferred to one of DMA buffers DMAbufL 102 or DMAbufH 104 (depending on endian format). Thus, holding register PFHR2 108 is provided with tag holding register 126 if such a transfer is necessary. The contents of tag holding registers 122 and 126 are monitored by control logic 160.

If a tag should appear in either tag holding register 122 or 126, processing may be interrupted by control logic 160, and the host computer or peripheral may be notified of the presence of the address command byte. The contents of the holding registers PFHR1 106 and PFHR2 108 may then be read by the host computer or peripheral device and acted upon accordingly. Command address bytes are not transferred to DMA buffers DMAbufL 102 or DMAbufH 104, as the command address bytes are not intended as data for memory 150. Since DMA buffers DMAbufL 102 and DMAbufH 104 are not provided with tag holding registers, the tag would be lost if the data were transferred to the DMA buffers and the special status of the command byte would be indistinguishable from ordinary data.

In the RLE format, the byte in FIFO 112 immediately following the run length count byte is required to be a data byte and, under direction from control logic 160, is transferred to pipeline holding register PFHR1 106. In run length encoding (RLE) the command byte indicates the number of times the following data byte should be repeated. Thus, in order to decompress the data, the pipeline needs to repeat the contents of holding register PFHR1 106 for the number of times indicated by the run length count byte stored in run length count register 110.

With each proceeding clock cycle, the data byte is copied from holding register PFHR1 106 over pipeline data connection PDC to holding register PFHR2 108, and run length count register 110 is decremented by one. With subsequent clock cycles, the data byte in holding register PFHR2 passes through the pipeline as ordinary data, first from holding register PFHR2 108 to DMAbufL 102 and DMAbufH 104 to form 16 bit words for System Bus SB. This process is repeated until run length count register 100 reaches zero and the data has been completely decompressed. Holding register PFHR1 106 then reverts to normal operation, processing data bytes from FIFO 112 until another command byte is received.

Operation of Pipeline for Transmitted Data

The reverse data process operates in a similar manner as the receiving data process outlined above. A sixteen bit word is received from system data bus SB and stored in DMA buffers DMAbufL 102 and DMAbufH 104, with the high byte being stored in DMAbufH 104 and the low byte being stored in DMAbufL 102. When the DMA buffers are full, as indicated by full status holding registers 128 and 130, respectively, the data within DMA buffers DMAbufL 102 and DMAbufH 104 are sequentially transferred through pipeline FIFO holding registers PFHR1 106 and PFHR2 108 into 64 byte FIFO 112. As discussed above, the order in which data is taken from DMA buffers DMAbufL 102 and DMAbufH 104 depends upon the endian format used. Data bytes stored in FIFO 112 are then transferred in an 8 bit parallel format through ECP data path 114.

The pipeline may be used in order to compress data using run length encoding. It should be noted that the pipeline of the present invention does not require that run length encoding be used. For example, if the device (host computer or peripheral) is communicating with another device which is not capable of using run length encoding, the RLE feature may be disabled by setting a control register within control logic 160.

As discussed above, in run length encoding, data is compressed by taking identical bytes of data and compressing them into a data byte and a command byte. The data byte indicates the actual content of the byte which is to be repeated and the command byte indicates the number of times that byte is to be repeated (run length count).

Run length encoding can compress any number of identical bytes into two bytes, the command byte and the data byte. However, since compressing two identical bytes using run length encoding does not result in any savings, the minimum number of identical bytes compressed is typically three. Data transferred from System Bus SB in 16 bit format is stored in DMA buffers DMAbufL 102 and DMAbufH 104 as before. Again, data passes through the pipeline through holding registers PFHR1 106 and PFHR2 108. Comparators 130 and 131 compare the contents of holding registers PFHR1 106 and PFHR2 108 with the next DMA buffer to be read in the sequence (DMAbufL 102 or DMAbufH 104). If all three bytes are identical, then run length encoding is initiated.

When run length encoding is initiated, the run length count register is first cleared, and then incremented by one. On subsequent clock cycles, the data passes through the pipeline as before, with the exception that the contents of holding register PFHR2 are not transferred to FIFO 112, but rather are overwritten by the identical byte from holding register PFHR1. Subsequent comparisons are made using only 132 to determine whether the next byte in holding register PFHR1 106 is identical to the byte stored in holding register PFHR2 108. If the two bytes are identical, run length count register 110 is incremented again and the process is repeated.

The run length compression process is repeated until a succeeding byte from holding register PFHR1 106 does not match the contents of holding register PFHR2 108, or until run length count register reaches its limit of 127 (128 repeated characters). If a non-matching byte is detected in PFHR1, the contents of run length count register 110, along with a tag bit, are first transferred to FIFO 112, followed by the contents of holding register PFHR2. Processing returns to the normal state until another match of three or more bytes is detected.

Control logic 160 monitors run length count register 110 to determine whether a maximum compression code condition occurs. In the preferred embodiment (ECP compatible) the maximum number of bytes which may be compressed is 128. Since the ECP protocol allows only seven bits in the command byte for run length count, the maximum count in run length count register 110 is 127 (i.e., binary 1111111). When this level is reached, control logic 160 first transfers the contents of run length count register 110, along with a tag bit, to FIFO 112, followed by the contents of holding register PFHR2. Run length encoding may be immediately restarted if the succeeding three bytes are also identical, or processing may return to the normal state until another match of three or more bytes is detected.

The pipeline of the present invention provides a portion in the data path from memory 150 to ECP data path 114 where the data path may be monitored to provide encoding and decoding, as well as convert 16 bit words into two eight bit bytes. The pipeline allows for DMA transfers without interrupting the flow of data. The number of holding registers selected for the pipeline are carefully chosen to prevent interruptions in the pipeline flow, such that the pipeline may support DMA access. In the receive mode, if the pipeline does not maintain adequate data flow, a "bubble" in the pipeline may occur when an attempt is made to read an empty holding register. In the transmit mode, each holding register in the pipeline must be read before data is subsequently written to that holding register, or an overwrite condition occurs. The operation of the holding registers to prevent "bubbles" and overwrite conditions is described below in connection with FIGS. 2 and 3.

Pipeline Operation—Transmit Mode

Figure 2:
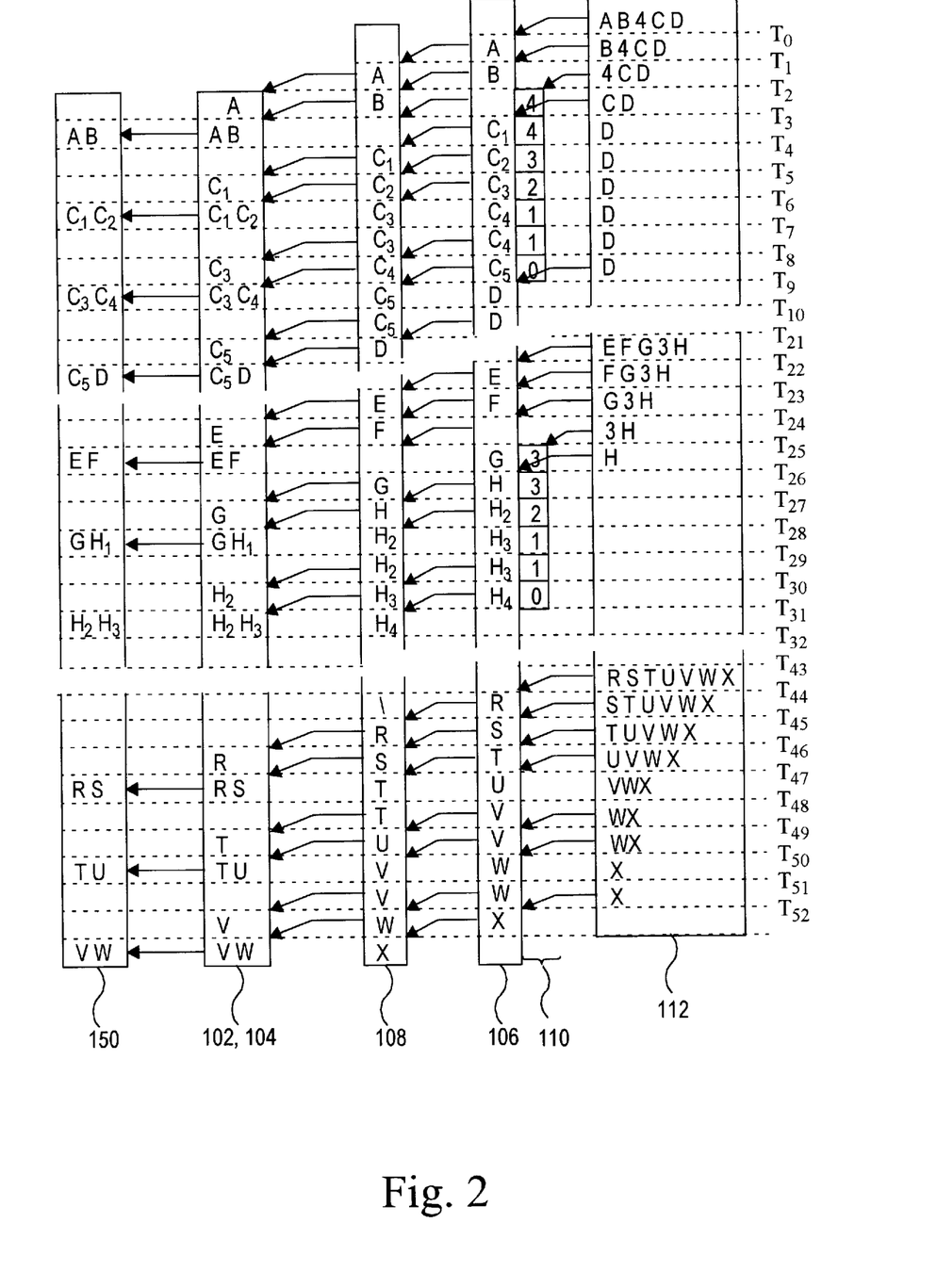
FIG. 2 shows a pipeline timing diagram showing data being transferred in RLE format from a communications port to a peripheral or host device.
Figure 3:
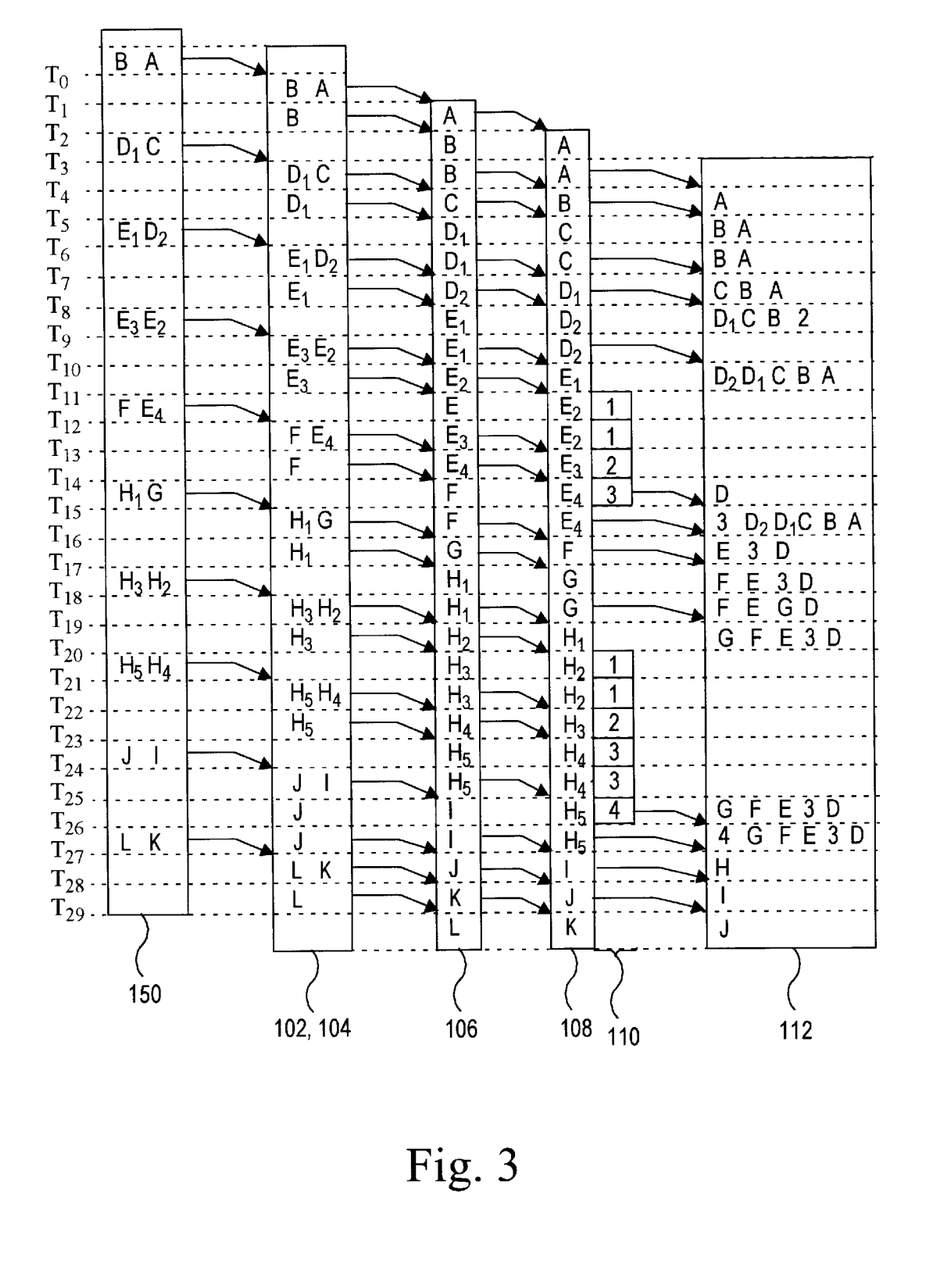
FIG. 3 shows a pipeline timing diagram showing data being transmitted from a peripheral or host device, converted into RLE format and transmitted through a communications port.

FIG. 3 shows a pipeline timing diagram for the pipeline shown in FIG. 1, where data is being transmitted from memory 150 to ECP data path 114. In the diagrams of both FIGS. 2 and 3, each portion of the pipeline is represented for successive clock cycles, T0, T1, T2, . . . starting at the top of the page and progressing down. Arrows indicate where a data byte is asserted to the next stage in the pipeline.

For the sake of illustration, DMA buffers DMAbufL 102 and DMAbufH 104 are shown as one DMA buffer 102,104. Also for the sake of illustration, the contents of each buffer is represented by a letter designation. This letter designation may represent an actual ASCII character, or may be representative of some other type of data byte. If a data byte is repeated, a subscript is used to distinguish identical data bytes. The letters used here are for purposes of illustration only. Other types of data may also be transmitted through the pipeline of FIG. 1.

As shown in FIG. 3, DMA buffers 102, 104 are initially empty or contain some other data (i.e., "don't care" condition) as indicated a blank space character. Two bytes A and B are loaded from a sixteen bit data word from memory 150 into DMA buffers 102,104 at time T0. At time T1, the low byte A is transferred to holding register PFHR1 106, while high byte B is transferred to the low byte portion of DMA buffers 102,104. For the purposes of illustration in FIG. 3, a little endian format is used for data transmission. However, so-called big-endian transmission formats may also be used (high byte first) without departing from the spirit or scope of the invention.

In successive clock cycles, T2 and T3, byte A is transferred to holding register PFHR2 108 and then to FIFO 112. Byte B is transferred in the pipeline one clock cycle behind byte A. Once bytes A and B are in FIFO 112, they are then transferred in turn through ECP data path 114. Bytes A and B represent normal data bytes, and thus, clock cycles T0 through T6 in FIG. 3 show the progression of normal data bytes through the pipeline.

As can be readily ascertained from FIG. 3, DMA buffers 102,104 are loaded with a new data word from memory 150 every third clock cycle (T0, T3, T6, T9, . . . ). Thus, at time T3, three clock cycles after data bytes A and B have been loaded into DMA buffers 102, 104, new data bytes $D_1$ and C are loaded from Memory 150 to DMA buffers 102, 104. For the purposes of illustration in FIGS. 2 and 3, subscripts are used with the byte designators to show identical bytes which may be compressed using run length encoding.

Bytes $D_1$ and C are processed in a similar manner as bytes A and B discussed above. Note, however, that as with bytes A and B, the succeeding bytes, in this instance $E_1$ and $D_2$, will appear in the pipeline before bytes $D_1$ and C are transferred to FIFO 112, as shown at time T6. Thus, at any given instant, three succeeding bytes may be compared within the pipeline. In this instance, only two successive "D" bytes $D_1$ and $D_2$ are present in the pipeline, at time T6 and thus the "D" bytes will not be compressed using run length encoding.

As shown in FIG. 3, four successive "E" bytes $E_1$, $E_2$, $E_3$, and $E_4$ are retrieved from memory 150 at times T6–T12. At time T10, three "E" bytes $E_1$, $E_2$, and $E_3$ are present in the pipeline and may be compared by comparators 130 and 132 in FIG. 1. At time T11, run length counter 110 is set to 1 and the successive byte $E_2$ is written over byte $E_1$ in holding register PFHR2. The process is repeated unit the last "E" byte $E_4$ passes to holding register PFHR2 at time T14. At time T15, the contents of run length count register 110 (in this instance, a byte representing the number "3") is transferred to FIFO 113. At time T16, the data byte "E" is transferred from holding register PFHR2. Thus, the four identical "E" bytes have been compressed into two bytes, the command byte "3" and the data byte "E". Note that since the minimum number of bytes compressed is always three, the command byte may represent a number less than the of total bytes compressed. In this instance, the command byte represents n–1 data bytes, where n is the number of identical data bytes compressed.

FIG. 3 shows yet another example, where five "H" bytes are compressed in a similar manner to the four "D" bytes. Note that in all of the examples shown in FIG. 3, DMA buffers 102, 104 are emptied every three clock cycles. Thus, a new sixteen bit data word may be loaded from memory 150 every three clock cycles, and an uninterrupted sequence of DMA transfers may take place. The pipeline of the present invention contains the correct number of elements (DMA buffers DMAbufL 102, DMAbufH 104, holding registers PFHR1 106, PFHR2 108) to allow this DMA transfer to take place. The use of fewer elements would create overwrite conditions, generating data errors and thus interruptions in the data transfer process, preventing memory 150 from loading a new sixteen bit data word every three clock cycles. Such overwrite conditions in the pipeline would prevent the use of DMA transfers. Any additional pipeline elements beyond that shown in FIG. 1, would be superfluous. Thus, the present invention provides the optimum efficient design for providing run length encoding on an on-the-fly basis while allowing for DMA transfers of data through the ECP data path.

Pipeline Operation—Receive Mode

FIG. 2 shows a timing diagram for the reverse path of data from ECP data path 114 to memory 150. At time T0, the data in FIFO 112 comprises at least the first five bytes comprising data bytes "A" and "B", command (run length count) byte "4" and data bytes "C" and "D". This sequence of bytes, fully decompressed would read "A,B,C,C,C,C,C,D". At times T0–T4, data bytes "A" and "B" are transferred though the pipeline to memory 150, as shown in FIG. 2.

At time T2, however, command byte "4" is transferred from FIFO 112 by control logic 160 to run length count register 110. Control logic 160 recognizes that command byte "4" is a command byte by the associated tag bit (not shown) stored in FIFO 112. Control logic further recognizes that command byte "4" is a run length count byte by monitoring the MSB of command byte "4". In this instance, command byte "4" is a run length count indicating that the subsequent data byte should be repeated four times, for a total of five "C" data bytes.

At time T3, data byte "C" is transferred from FIFO 112 to first holding register PFHR1 106. On subsequent clock cycle T4, the contents of holding register PFHR1 106 is copied to holding register PFHR2 108, and the contents of run length count register 110 is decremented by one. At clock cycle T5 the contents of holding register PFHR2 108 is transferred to the high byte portion of DMA buffers 102, 104 and the contents of DMA buffers 102, 104 are transferred to memory 150 by DMA transfer.

The decoding process is repeated until run length count register 110 reaches zero at time T8. At this point, the contents of holding register PFHR1 106 are transferred on the next clock cycle T9 to holding register PFHR2 108, while the next byte "D" is read from FIFO 112 also at time T9.

Note that in memory 150, the repeated byte "$C_5$" and normal data byte "D" are shared within the same memory word. The pipeline of the present invention allows compressed data to be initiated regardless of the byte position (high byte or low byte) of the starting or ending byte in the sequence in the memory. The sequence at clock cycles T21–T32 illustrates the decompression sequence for run length encoded data where the starting byte is the low byte in memory.

Note that in all of the examples shown in FIG. 2, no "bubbles" occur. That is, at each transfer stage where data is transferred from one portion of the pipeline to another, there is always valid data present at the holding register or buffer where the data is to be transferred from. Thus, the present invention can provide for a one word transfer from DMA buffers 102, 104 in as little as three clock cycles, allowing for uninterrupted DMA transfers.

In the last example of FIG. 2, an odd byte "X" remains at the end of the pipeline. A stale data timer is provided to determine whether the "X" byte is indeed the last data byte. If additional data is forthcoming, this data will be appended after the "X" byte. However, if the data stream ends on a single byte (byte/word misalignment) provision must be made within control logic 160 to accommodate this remaining byte. In one approach is for control logic 160 to provide an accompanying dummy byte to complete the last data word. Control logic may then communicate with the host processor to indicate that the last byte is not valid data.

In the preferred embodiment, the odd byte "X" is left in holding register PFHR2 108 and an interrupt signal is generated by control logic 160 over system bus SB. Since each of the elements in the pipeline may be addressed and read (or written to) by the host processor, the host processor may then retrieve the odd byte and transfer the odd byte to memory 150 using programmed I/O.

The pipeline shown in FIG. 1 is also provided with some additional features which facilitate use. For example, control logic 160 may direct data transfers (both read and write) from the pipeline to memory 150 using DMA transfers by generating the necessary DMA handshake over system bus SB. However, for small amounts of data, DMA transfers may not be an efficient technique for transferring data.

Thus, control logic 160 may provide for both DMA and read/write addressing of DMA buffers DMAbufL 102 and DMAbufH 104, depending on the amount of data to be transferred. In read/write addressing, the host system (not shown) may provide chip select, address and data strobe signals to randomly access any portion of the pipeline. For DMA transfers, a host system DMA controller (not shown) may generate the DMA acknowledge handshake to initiate a DMA transfer to or from DMA buffers DMAbufL 102 and DMAbufH 104 while the DMA controller simultaneously or sequentially performs random access of memory 150.

Control logic 160 monitors the status of FIFO 112 using a stale data timeout to determine whether any additional data has been received. Small amounts of data, or single bytes may be transferred to memory 150 using the read/write addressing mode. The stale data timeout monitors the reception of any additional incoming data so as to prevent the switching from DMA mode to read/write address mode if additional data is received which would warrant continued DMA transfers.

As discussed above, the pipeline of the present invention may be provided within a VLSI or custom ASIC, which may be used in a host computer or peripheral device. To facilitate the implementation of the pipeline, at least one data error holding register 170 may be provided for debugging purposes to support the system developer. A system developer may comprise, for example, a peripheral designer or manufacturer (e.g., laser printer manufacturer) or the designer or manufacturer of a host computer or interface equipment. Data error holding register 170 may be provided to monitor the condition of one or more of the elements of the pipeline (holding registers PFHR1 106 and PFHR2 108, DMA buffers DMAbufL 102 and DMAbufH 104, run length count register 110, and FIFO 112). If an overflow or bubble condition exists, a corresponding bit in data error holding register 170 is flagged and processing may be interrupted.

As discussed above in connection with FIGS. 2 and 3, when the pipeline is operating properly, such bubble or overwrite conditions should never occur. However, during development of associated hardware and software, it may be possible that a software written by system developer or an external DMA processor may improperly access the elements of the pipeline and thus disrupt the normal operation of the pipeline. Due to the efficient and closely timed nature of the pipeline of the present invention, it would be difficult for the system developer to track the source of overwrite or bubble errors, with the use of conventional logic monitoring equipment. Data error holding register 170 provides the developer with a useful tool for debugging the system in which the pipeline is applied.

Data error holding register 170 may comprises one or more bit registers for each DMA buffer and holding register, each having an overwrite and bubble error bit to detect overwrite and bubble conditions, respectively. When either of these errors occurs, the corresponding bit is set in data error holding register 170, which may in turn be read by an external host computer or development tool. Data error holding register 170 may be coupled to control logic 160, which in turn may interrupt processing upon detection of an overwrite or bubble error. Data error holding register 170 may not be required for general use, once the overall system has been developed and debugged.

The present invention described above may be suitably modified to provide other modes of operation without departing from the spirit and scope of the invention. For example, although the present invention is described in terms of the ECP protocol, other data transmission protocols may also be used. Similarly, the system bus SB is described in the present invention as a 16 bit system bus. However, other system bus widths may also be used with suitable modifications. For example, for a 32 bit wide system bus, four DMA buffers may be provided to divide the 32 bit word into four eight bit bytes. In addition, other data transmission widths may be used, for example, 16 or 32 bits wide. The widths of the DMA buffers and holding registers may be suitably altered to provide data transmission in alternate widths. Other combinations of system bus widths, pipeline bus widths and data transmission widths are possible without departing from the spirit and scope of the invention. In addition, a parallel to serial converter may be used at the output of the device to convert data to serial mode for transmission over a serial data port (e.g., RS-232, 422 or the like).

It should also be noted that although the present invention is disclosed as being applied to transfer data from a memory to a parallel data path, the pipeline of the present invention may have other applications where data compression or expansion is required. For example, the pipeline may be used as an interface between a SCSI bus and memory storage device. Other applications where RLE encoding is applied are also within the spirit and scope of the invention.

In addition, although the pipeline of the present invention is disclosed as used in a half-duplex mode, dual pipelines or hardware may be used to implement the present invention in full duplex modes. Further, in the above description, run length encoding is described as being limited to a 64:1 compression ratio (128 repeated characters) whereas other compression ratios and repeated character lengths may be utilized without departing from the spirit and scope of the invention.

Other modifications are also possible and contemplated within the scope of the invention. For example, the DMA buffer holding registers 102 and 104 are shown connected to holding registers 106 and 108 in a multiplexed fashion via pipeline data connection PDC. That is to say, data from either of DMA buffers 102 or 104 may be transferred to first holding register 106 in the transmit mode, and data from second holding register 108 may be transferred to either of DMA buffers 102 and 104 in a receive mode.

Other modifications are also possible. Although the present invention is disclosed as transferring data every three clock cycles from memory 150, larger numbers of clock cycles may also be used, providing wait states for the pipeline. For debugging or other purposes, the run length encoding or decoding pipeline of the present invention may be selectively disabled by addressing a register within control logic 160.

In an alternative embodiment, the pipeline may be configured in a shift mode. In the shift mode, both DMA buffers 104 and 102 are loaded simultaneously from memory 150 with high and low bytes, respectively. However, on subsequent clock cycles, the bytes are shifted to the next adjacent buffer or holding register. Thus, on a first clock cycle, the low byte in DMA buffer 102 is transferred to the first holding register 106, and the high byte in DMA buffer 104 is transferred to DMA buffer 102. Subsequent clock cycles repeat the shift from DMA buffer 102 to holding register 106, whereas the contents of holding register 106 are transferred to holding register 108. The shift mode, while a less flexible design, may provide some economies in control logic.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

I claim:

1. An apparatus for interfacing a memory with a parallel communications port, comprising:

a first memory buffer, coupled to the memory, for receiving a first data segment from the memory;

a second memory buffer, coupled to the memory, for receiving a second data segment from the memory;

a first holding register, coupled to said first and second memory buffers, for receiving the first or second data segment from either said first or second memory buffers;

a second holding register, coupled to said first holding register, for receiving the first or second data segment from said first holding register;

a FIFO, coupled to said second holding register, for receiving the first or second data segment from said second holding register;

a first comparator, for comparing the contents of said first and second holding registers;

a second comparator, for comparing the contents of said first holding register with one of said first and second memory buffers;

a run length count register, coupled to said FIFO, for storing a segment of information indicating a number of identical data segments; and a control logic, coupled to said first and second memory buffers, said first and second holding registers, said first and second comparators, and said run length count register, for comparing the outputs of said first comparator and said second comparator, incrementing said run length count register if the comparison of said first and second comparators shows that the contents of said first and second holding registers correspond to one of said first and second memory buffers indicating that more than two identical data segments are detected, and outputting to said FIFO the contents of said run length count register as a command data segment representing the number of identical data segments, followed by a regular data segment representing the data segment from said second holding register.

2. The apparatus of claim 1, wherein said FIFO receiving the contents of run length count register as the command data segment along with an associated tag indicating that the command data segment comprises the number of identical data segments.

3. The apparatus of claim 1, further comprising:

a data error holding register, coupled to said control logic, said first and second holding registers, and said first and second data buffers, wherein said control logic monitors said first and second holding registers and said first and second data buffers for overwrite and bubble conditions and sets a corresponding bit in said data error holding register if an overwrite or bubble condition occurs.

4. A bi-directional data pipeline for interfacing a memory with a communications port, comprising:

a first memory buffer, coupled to the memory, for selectively receiving and transferring a high data byte to and from the memory;

a second memory buffer, coupled to the memory, for selectively receiving and transferring a low data byte to and from the memory;

a first holding register, coupled to said first and second memory buffers, for selectively receiving a high or low data byte from said first and second memory buffers, respectively;

a second holding register, coupled to said first holding register and said first and second memory buffers, for sequentially receiving high and low data bytes from said first holding register and for alternately transferring high and low data bytes to said first and second memory buffers, respectively;

a FIFO, coupled to said first and second holding registers, for sequentially receiving the high and low data bytes from said second holding register and transferring successively the high or low data byte to said first holding register;

a first comparator, coupled to said first and second holding registers, for comparing the contents of said first holding register and said second holding register;

a second comparator, coupled to said first holding register and said first and second memory buffers, for comparing the contents of said first holding register with one of said first and second memory buffers;

a run length count register, coupled to said FIFO, for storing a byte of information indicating a number of identical data bytes; and a control logic, coupled to said first and second memory buffers, said first and second holding registers, said first and second comparators, and said run length count register, for controlling the transmission of data in the pipeline in a first direction by comparing the output of said first comparator and said second comparator, incrementing said run length count register if said first and second comparators show that the contents of said first and second holding registers and one of said first and second memory buffers are identical indicating that more than two identical data bytes are detected, and outputting to said FIFO the contents of said run length count register followed by a data byte representing the data byte stored in said first and second holding registers and one of said first and second memory buffers to provide compression of the data, and for controlling the transmission of data in the pipeline in a second direction by receiving from said FIFO a high byte of data and a tag corresponding to said high byte of data, if said tag has a predetermined value, storing said high byte of data in said run length count register, receiving a second byte from said FIFO and storing said second byte in said first holding register, repeating the contents of the first holding register to said second holding register and decrementing the run length count register to provide decompression of the data.

5. In a bi-directional data pipeline for interfacing a memory with a communications port, comprising a first memory buffer coupled to the memory, a second memory buffer coupled to the memory, a first holding register coupled to said second memory buffer, a second holding register coupled to said first holding register and said first and second memory buffers, a FIFO coupled to said first and second holding registers, a first comparator coupled to said first and second holding registers, a second comparator coupled to said first holding register and said first and second memory buffers, a run length count register coupled to said FIFO, and a control logic coupled to said first and second memory buffers, said first and second holding registers, said first and second comparators, and said run length count register, a method for controlling the transmission of data in the pipeline comprising the steps of:

loading said pipeline with data, by
 (a) receiving a high data byte in said first memory buffer,
 (b) receiving a low data byte in said second memory buffer,
 (c) transferring the content of said second memory buffer to said first holding register,
 (d) transferring the content of said first holding register into said second holding register, (e) transferring the content of said first memory buffer to said first holding register, (f) receiving a second high data byte in said first memory buffer, and (g) receiving a second low data byte in said second memory buffer, comparing, with said first comparator, the content of said first and second holding registers, and outputting a signal indicative of whether the content of the first and second holding registers correspond, comparing, with said second comparator, the content of said first holding register and one of said first and second memory buffers, and outputting a signal indicative of whether the content of the first holding register and the second memory buffer correspond, comparing the outputs of said first comparator and said second comparator, incrementing said run length count register if the outputs of the first and second comparators show that the content of said first and second holding registers and said second memory buffers correspond indicating that more than two identical data bytes are detected, and outputting to said FIFO the content of said run length count register followed by a data byte representing the data byte stored in said first and second holding registers and one of said first and second memory buffers, to provide compression of the data.

6. In a bi-directional data pipeline for interfacing a memory with a communications port, comprising a first memory buffer coupled to the memory, a second memory buffer coupled to the memory, a first holding register coupled to said second memory buffer, a second holding register coupled to said first holding register and said first and second memory buffers, a FIFO coupled to said first and second holding registers, a first comparator coupled to said first and second holding registers, a second comparator coupled to said first holding register and said first and second memory buffers, a run length count register coupled to said FIFO, and a control logic coupled to said first and second memory buffers, said first and second holding registers, said first and second comparators, and said run length count register, a method for controlling the reception of compressed data in the pipeline to provide their decompression comprising the steps of:

receiving from said FIFO a first byte of data and a tag corresponding to said first byte of data, detecting the value of said tag, if said tag has a predetermined value, storing in said run length count register said first byte of data indicating a predetermined number of times a second byte of data following said first byte of data is to be repeated, said predetermined number being greater than two, receiving said second byte from said FIFO and storing said second byte in said first holding register, copying the content of the first holding register to said second holding register the predetermined number of times greater than two, and decrementing the run length count register.

7. A method of transmitting data from a memory through a data pipeline and to a data path and selectively compressing said data within the pipeline, comprising the steps of:

receiving from said memory at least one data word;

storing said data word as individual data bytes in at least one data buffer;

transferring one data byte from said data buffer to the first holding register; and transferring said one data byte from said first holding register to a second holding register;

transferring another data byte from said data buffer to a first holding register;

comparing the content of said first and second holding registers with another data byte retrieved from said memory and stored in said memory buffer;

if the content of said first and second holding registers and another data byte retrieved from said memory and stored in said memory buffer are not in correspondence, transferring said one data byte from said second holding register to the data path;

if the content of said first and second holding registers and another data byte retrieved from said memory and stored in said memory buffer are in correspondence with each other indicating that more than two identical data bytes are detected, incrementing a run length count register and transferring the content of said first holding register to said second holding register to provide compression of the data.

8. A data pipeline for transmitting data from a data source to a data path, comprising:

a pipeline comprising a plurality of data registers for receiving data segments from said data source, control means, coupled to said pipeline, for selectively controlling the transfer of data segments to and from data registers within said pipeline, and for controlling the transfer of data segments to and from said pipeline, said control means comparing the data segments in the data registers to select a first type of data if at least a predetermined number of the data segments greater than two are identical, said first type of data being compressed and transmitted to said data path, together with a second type of data representing non-compressed data, and a data error holding register, coupled to said plurality of data registers, wherein said control logic monitors said plurality of data registers for overwrite and bubble conditions and sets a corresponding bit in said data error holding register if an overwrite or bubble condition occurs.

9. The data pipeline according to claim 8, wherein said plurality of data registers may be selectively read and written to by an external processor independently of said control logic.

10. A method of transmitting data through a data pipeline to a data path comprising the steps of:

loading a sequence of data bytes into a first data register in the data pipeline, sequentially transferring said sequence, one data byte at a time, through second and third data registers in said data pipeline and simultaneously comparing the data bytes in said first, second and third data registers to detect identical data bytes, selecting a first type of data if at least a predetermined number of sequential data bytes identical to one another is detected in said first, second and third data registers, the predetermined number of sequential data bytes being greater than two, selecting a second type of data if a detected number of sequential data bytes identical to one another is less than or equal to said predetermined number, encoding said first type of data to generate a command segment representing said number of the sequential identical data bytes greater than two and a data segment representing each of the identical data bytes, and sequentially transmitting said encoded first type of data representing compressed data, and said second type of data representing non-compressed data, one data byte at a time, to said data path.

11. The method according to claim 10, further comprising the steps of:

generating a tag indicating said command segment, wherein said step of transmitting further includes the step of transmitting said tag with said command segment representing said number.

12. The method according to claim 10, wherein said step of loading further comprises the step of:

transferring data segments from a memory to the pipeline using direct memory access.

13. A system for transmitting data from a data source to a data path comprising:

first, second and third data registers for sequential receiving a sequence of data bytes, one data byte at a time, comparing means coupled to said data registers for simultaneously comparing contents of said first, second and third data registers to detect identical data bytes, counting means responsive to said comparing means for counting a number of sequential identical data bytes detected by said comparing means in said sequence to select a first type of data representing at least a predetermined number of sequential data bytes identical to one another, the predetermined number of sequential data bytes being greater than two, and to select a second type of data representing the data bytes unique in said sequence, and a number of sequential data bytes identical to one another, this number being less than or equal to said predetermined number, encoding means responsive to said counting means for encoding said first type of data to generate a command segment representing said number of the sequential identical data bytes greater than two and a data segment representing each of the identical data bytes, and transmitting means responsive to said data registers and said encoding means for sequentially transmitting said encoded first type of data representing compressed data, and said second type of data representing non-compressed data, one data byte at a time, to said data path.

14. The data pipeline of claim 3, wherein said data source comprises a memory and said data bytes are received in said pipeline by direct memory access.

15. The data pipeline of claim 13, wherein said transmission means further includes:

a FIFO, coupled to a predetermined one of at least three of said data registers and said counting means, for receiving contents of said counting means and an associated tag, followed by the data segment from said predetermined one of said at least three data registers wherein said tag indicates whether each of said data segments is said command data segment.

16. In a bidirectional pipeline, a method of selectively compressing data transmitted from a data memory to a data path and selectively decompressing data received from said data path for storing in said data memory, comprising the steps of receiving a first data segment from said data path;

in response to detection of a tag indicating that compressed data is received, selectively loading into a counting register said first data segment indicating a predetermined number of times a second data segment following the first data segment is to be repeated, said predetermined number of times being greater than two;

receiving said second data segment from said data path following said first data segment having said tag, and loading said second data segment into a predetermined one of a plurality of data registers in said data pipeline;

copying the content of said predetermined one of said plurality of data registers the predetermined number of times and decrementing said counting register to decompress the compressed data;

sequentially transferring said first data segment over said data pipeline, if said tag is not detected;

transmitting a sequence of data sequence from said data memory into said data registers, and simultaneously comparing contents of at least three of said data registers to detect sequential identical data segments transmitted from said data memory, compressing data transmitted to said data path if a number of detected sequential identical data segments is greater than two, and transmitting non-compressed data to said data path if said number of detected sequential identical data segments is less or equal to two.

17. The method according to claim 16, wherein said step of selectively loading further comprising the steps of:

reading a portion of said first data segment, and selectively loading said first data segment into said counting register if said tag has a predetermined value and said portion of said first data segment has a predetermined value.

18. The method according to claim 16, further comprising the step of:

transferring data segments from at least one of said plurality of registers to a memory by direct memory access.

19. A bidirectional data pipeline for selectively compressing data transmitted from a data memory to a data path and selectively decompressing data received from said data path for storing in said data memory, comprising:

a plurality of data registers for providing sequential bidirectional data transfer between said data memory and said data path, a predetermined one of said plurality of registers sequentially receiving data segments from said data path, counting means coupled to said data path for receiving a command data segment from said data path indicating a number of repeated data segments, in response to a tag indicating that compressed data are received and requesting the received data to be decompressed, said number being greater than two, control means coupled to said pipeline and said counting means for reading the content of said counting means, and repeating the contents of said predetermined one of said plurality of data registers a number of times corresponding to said number of repeated data segments, and for sequentially transferring the received data segments to said data memory, if no tag indicating that compressed data are received and requesting the received data to be decompressed is detected, and comparing means coupled to said data registers for simultaneously comparing contents of at least three of said data registers to detect sequential identical data segments transmitted from said data memory, said control means being responsive to said comparing means for compressing data transmitted to said data path if a number of detected sequential identical data segments is greater than two, and for transmitting non-compressed data to said data path if said number of detected sequential identical data segments is less or equal to two.

20. The data pipeline of claim 19, wherein said data path comprises a FIFO and said data segments are stored in said FIFO along with the tag indicating whether each of said data segments is said command data segment.

* * * * *